United States Patent
Safarpour et al.

(10) Patent No.: US 7,725,871 B1
(45) Date of Patent: May 25, 2010

(54) SAT-BASED TECHNOLOGY MAPPING FRAMEWORK

(75) Inventors: Sean A. Safarpour, Toronto (CA);
Gregg William Baeckler, San Jose, CA (US); Jinyong Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 62 days.

(21) Appl. No.: 12/123,396

(22) Filed: May 19, 2008

Related U.S. Application Data

(62) Division of application No. 11/361,808, filed on Feb. 23, 2006, now Pat. No. 7,386,828.

(51) Int. Cl.
*G06F 17/50* (2006.01)
*H03K 19/00* (2006.01)

(52) U.S. Cl. .......................................... 716/17; 716/16
(58) Field of Classification Search ................. 716/16, 716/17
See application file for complete search history.

(56) References Cited

U.S. PATENT DOCUMENTS

| | | |
|---|---|---|
| 7,007,249 B2 | 2/2006 | Ly et al. |
| 7,210,112 B2 | 4/2007 | DeHon et al. |
| 7,299,155 B2 * | 11/2007 | Ebert et al. ................. 702/182 |
| 2005/0268256 A1 | 12/2005 | Tsai et al. |

OTHER PUBLICATIONS

Ling, Andrew et al.; "FPGA Architecture Evaluation and Technology Mapping using Boolean Satisfiability"; 2001, 8 pages.

* cited by examiner

*Primary Examiner*—Jack Chiang
*Assistant Examiner*—Magid Y Dimyan
(74) *Attorney, Agent, or Firm*—Townsend and Townsend and Crew LLP

(57) ABSTRACT

Valid implementations of functions with programmable logic blocks are efficiently determined by creating an approximation of a hardware configuration of programmable logic blocks to quickly screen out configurations unlikely to provide a valid results. If a configuration passes this first phase, the approximation is refined to search for valid function implementations with the hardware configuration. The approximation and refinement may use a partitioning of function input variables to logic blocks to reduce the search space. Additional conflict clauses may be used to further reduce the search space. Implementations of sample functions or other previously considered functions may be analyzed to identify conflict clauses that are reusable for analyzing other functions. A representation of potential implementations of a function can be subdivided into subsets and analyzed separately. The intersection of the solutions from each subset are valid implementations of the function.

9 Claims, 13 Drawing Sheets

SAT-BASED TECHNOLOGY MAPPING FRAMEWORK

CROSS-REFERENCES TO RELATED APPLICATIONS

This application is a divisional of U.S. patent application Ser. No. 11/361,808, filed Feb. 23, 2006, entitled "SAT-BASED TECHNOLOGY MAPPING FRAMEWORK,", which is related to commonly assigned U.S. patent application Ser. No. 11/201,565, entitled "MAPPING FUNCTIONS TO INCOMPLETE LOOK-UP TABLES," filed Aug. 10, 2005 (now U.S. Pat. No. 7,224,183, issued May 29, 2007), both of which are incorporated by reference herein for all purposes.

BACKGROUND OF THE INVENTION

The present invention relates to the field of programmable devices, and the systems and methods for programming the same. Programmable devices, such as FPGAs, typically include thousands of programmable logic cells or blocks (PLBs) that use combinations of logic gates and/or look-up tables to perform a logic operation. Programmable devices also include a number of functional blocks having specialized logic devices adapted to specific logic operations, such as adders, multiply and accumulate circuits, phase-locked loops, and memory. The logic blocks and functional blocks are interconnected with a configurable switching circuit. The configurable switching circuit selectively routes connections between the logic blocks and functional blocks. By configuring the combination of logic blocks, functional blocks, and the switching circuit, a programmable device can be adapted to perform virtually any type of information processing function.

A typical compilation process for determining the configuration of a programmable device, referred to compilation, starts with an extraction phase, followed by a logic synthesis phase, a fitting phase, and an assembly phase. The extraction phase takes a user design, typically expressed as a netlist in a hardware description language such as Verilog or VHDL, and produces a set of logic gates implementing the user design. In the logic synthesis phase, the set of logic gates is permuted over the hardware architecture of the programmable device in order to match elements of the user design with corresponding portions of the programmable device. The fitting phase assigns the various portions of the user design to specific logic blocks and functional blocks (sometimes referred to as placement) and determines the configuration of the configurable switching circuit used to route signals between these logic blocks and functional blocks (sometimes referred to as routing), taking care to satisfy the user timing constraints as much as possible. In the assembly phase, a configuration file defining the programmable device configuration implementing the user design is created. The programmable device configuration can then be loaded into a programmable device to implement the user design. Programmable devices can be configured with the configuration during or after manufacturing.

One of the substantial challenges of the logic synthesis phase is efficiently implementing portions of the user design with programmable device resources. Often, the logic synthesis phase strives to implement portions of the user with as few logic blocks as possible. The hardware description of user designs often includes a number of registers or flip-flops connected by numerous logic gates. Functional logic synthesis techniques evaluate the logic gates specified by the user design and determine corresponding abstract Boolean functions. These Boolean functions can then be mathematically manipulated into forms suitable for efficient implementation by the logic blocks of the programmable device.

Boolean functions can be classified as completely specified or incompletely specified. A completely specified function is fully defined for all input values. A completely specified function with N inputs typically requires of look-up table (LUT) of $2^N$ bits to implement. An incompletely specified function is undefined for some input values. The input values corresponding with undefined function values are referred to as don't-care inputs. It is often possible to implement incompletely specified functions with N inputs with a LUT having less than $2^N$ bits. A LUT or PLB having N inputs but less than $2^N$ bits is referred to as an incomplete LUT or PLB. A function that can be implemented using an incomplete LUT is referred to as an incomplete function.

Many user designs include incomplete functions. For relatively simple functions, these incomplete functions can often be implemented in a single logic block. For a function having a large number of inputs, it is often necessary to implement the function using a two or more logic blocks. To implement functions using multiple logic blocks, it is necessary to determine a partitioning of function input variables among the logic block; for each logic block, an assignment of function input variables and other logic block outputs to specific logic block input ports; and to determine the data values to be stored in the one or more LUTs in each logic block.

There are several prior functional logic synthesis techniques adapted to implement incomplete functions using a minimal amount of programmable device resources. However, these prior techniques perform poorly with incomplete functions having a large number of inputs or being implemented by two or more logic blocks. For example, binary decision diagrams (BDD) solver builds a decision tree data structure that enumerate the function outputs for all combinations of input values for different potential sets of logic block input port assignments. The BDD solver then extracts patterns from this decision tree data structure to determine if a given set of potential logic block input port assignments can implement the function correctly. Typically, the BDD solver must evaluate decision tree structures for a large number of different potential logic block input port assignments before finding an acceptable logic block input port assignment. Additionally, the size of each decision tree structure increases exponentially with the number of inputs. As a result, the memory requirements for a BDD solver are too large for use with functions with a large number of inputs, such as eight or more inputs.

Another prior functional logic synthesis technique formulates the implementation of functions in one or more logic blocks as a Boolean satisfiability (SAT) problem. With this approach, Boolean satisfiability solvers, or SAT solvers, can be used to determine valid implementations of incomplete functions with one or more logic blocks. Example SAT solver algorithms are described in "FPGA technology mapping: a study of optimality," A. Ling, D. Singh, and S. Brown, DAC, 2005, pp. 427-432, which is incorporated by reference herein. The memory requirements of SAT solvers are not as prohibitively large as those for BDD solvers. However, SAT solvers typically require long execution times to find solutions. Additionally, for very large functions, such those with ten or more input variables, the memory requirements for SAT solvers may be prohibitive.

It is therefore desirable to have a fast and efficient system and method to determine an implementation of complete or incomplete functions using single or multiple logic blocks. It is further desirable to reduce the execution time and memory requirements of SAT solvers to find valid implementations of functions. It is also desirable for the system and method to quickly screen out potential function implementations or logic block configurations that are not likely to provide acceptable results.

BRIEF SUMMARY OF THE INVENTION

An embodiment of the invention efficiently determines valid implementations of functions with programmable logic blocks by creating an approximation of a hardware configuration of programmable logic blocks to quickly screen out configurations unlikely to provide a valid results. If a configuration passes this first phase, the approximation is refined to search for valid function implementations. In an embodiment, the approximation and refinement use a partitioning of function input variables to logic blocks to reduce the search space. In a further embodiment, additional conflict clauses can be used to further reduce the search space. In another embodiment, implementations of sample functions or other previously considered functions can be analyzed to identify conflict clauses reusable for analyzing other functions. In an embodiment, a representation of potential implementations of a function can be subdivided into subsets and analyzed separately. The intersection of the solutions from each subset are valid implementations of the function.

In an embodiment, a method determines a configuration implementing a function using logic blocks of a programmable device. The method includes receiving a function and a hardware configuration for potentially implementing the function. The hardware configuration includes at least one logic block. Each logic block includes at least one logic block input. The method includes creating a partitioning the set of function input variables. The partitioning assigns each logic block of the hardware configuration at least a subset of the function input variables. The method includes creating an approximation of an implementation of the function with the hardware configuration and the partitioning of the set of function input variables and analyzing the approximation of the implementation for consistency with the function.

In response to a determination that the approximation of the implementation is consistent with the function, an embodiment of the method includes creating a refinement of the implementation of the function with the hardware configuration. In an embodiment, the refinement is consistent with the partitioning of the set of function input variables. The method includes analyzing the refinement of the implementation for consistency with the function.

In response to a determination that the refinement of the implementation is consistent with the function, an embodiment of the method includes providing implementation data. In a further embodiment, the implementation data includes an assignment of each of the set of function input variables to at least one logic block input of at least one logic block of the hardware configuration. In still a further embodiment, each logic block of the hardware configuration includes at least one look-up table, and the implementation data includes look-up table data for each logic block adapted to implement the function.

BRIEF DESCRIPTION OF THE DRAWINGS

The invention will be described with reference to the drawings, in which.

DETAILED DESCRIPTION OF THE INVENTION

Figure 1:
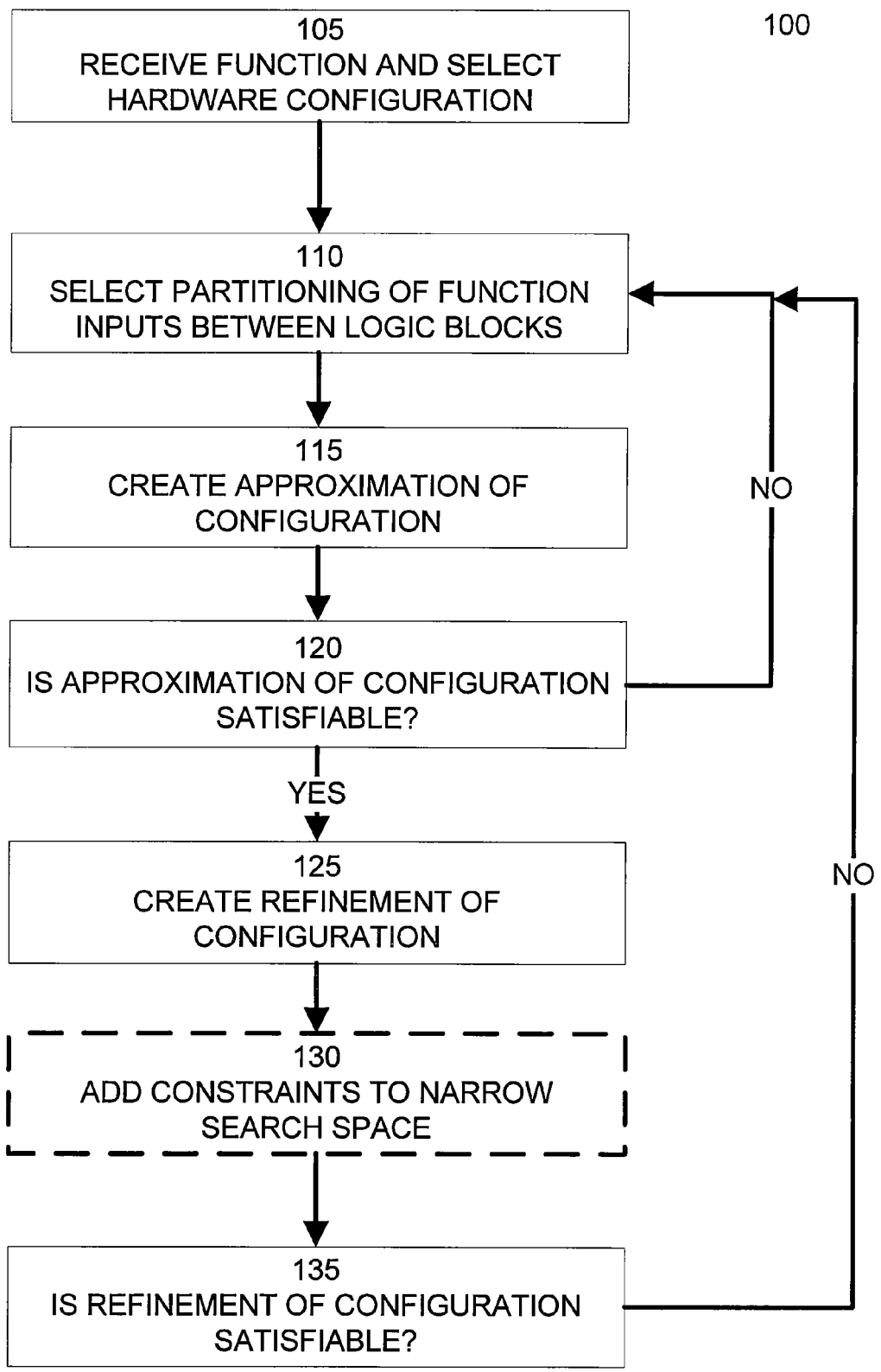
FIG. 1 illustrates a method of efficiently searching for valid function implementations according to an embodiment of the invention.

FIG. 1 illustrates a method 100 of efficiently searching for valid function implementations according to an embodiment of the invention. Method 100 decomposes the search for valid function implementations into an initial approximation phase followed by a refinement phase. This decomposition reduces the computationally expensive search for valid function implementations into two less computationally expensive sub problems.

Step 105 receives a function to be implemented using one or more logic blocks or other programmable device resources. In an embodiment, the function is received from a compilation process adapted to convert user designs into programmable device configurations. In an embodiment, the compilation process converts a portion of a user design specification, for example expressed as an arrangement of logic gates, into a Boolean function. This function is then passed to method 100.

Figure 2A:
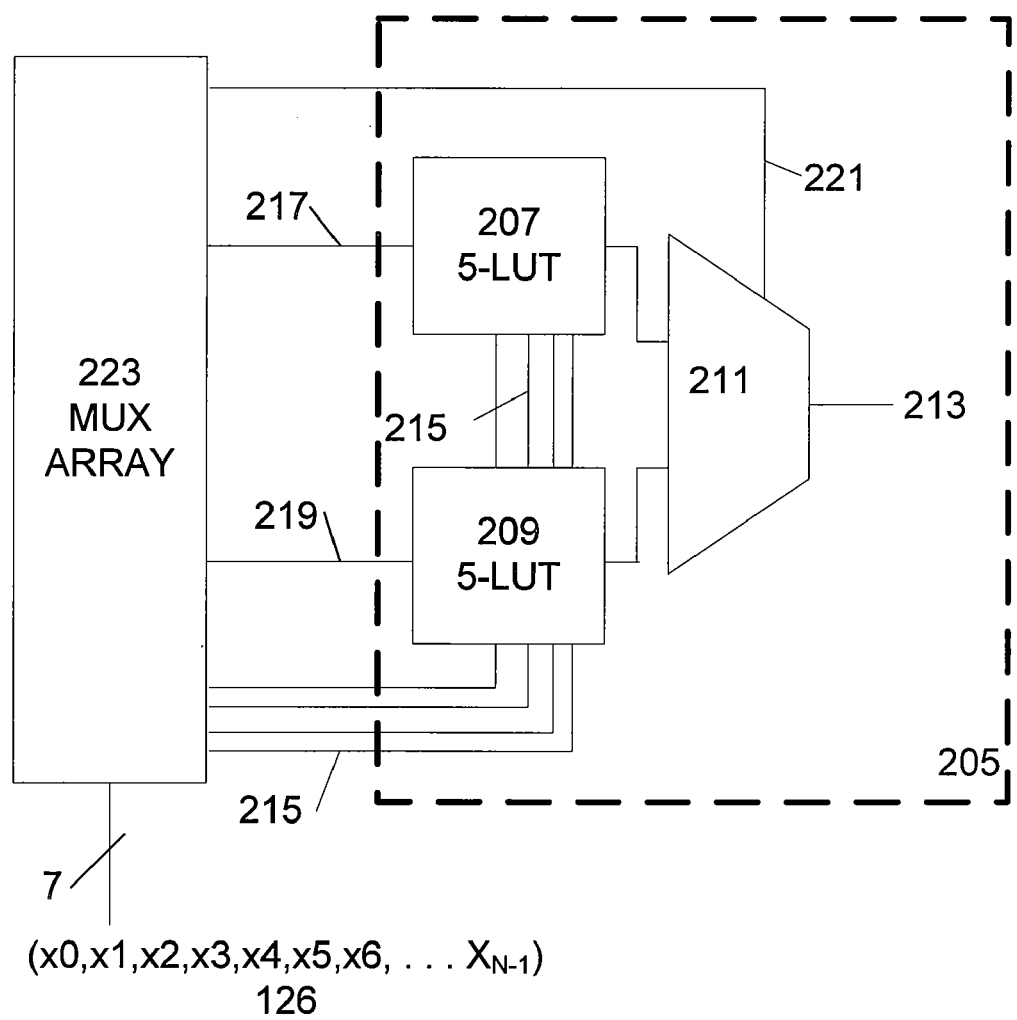
FIGS. 2A-2B illustrate example logic blocks suitable for use with an embodiment of the invention.
Figure 2B:
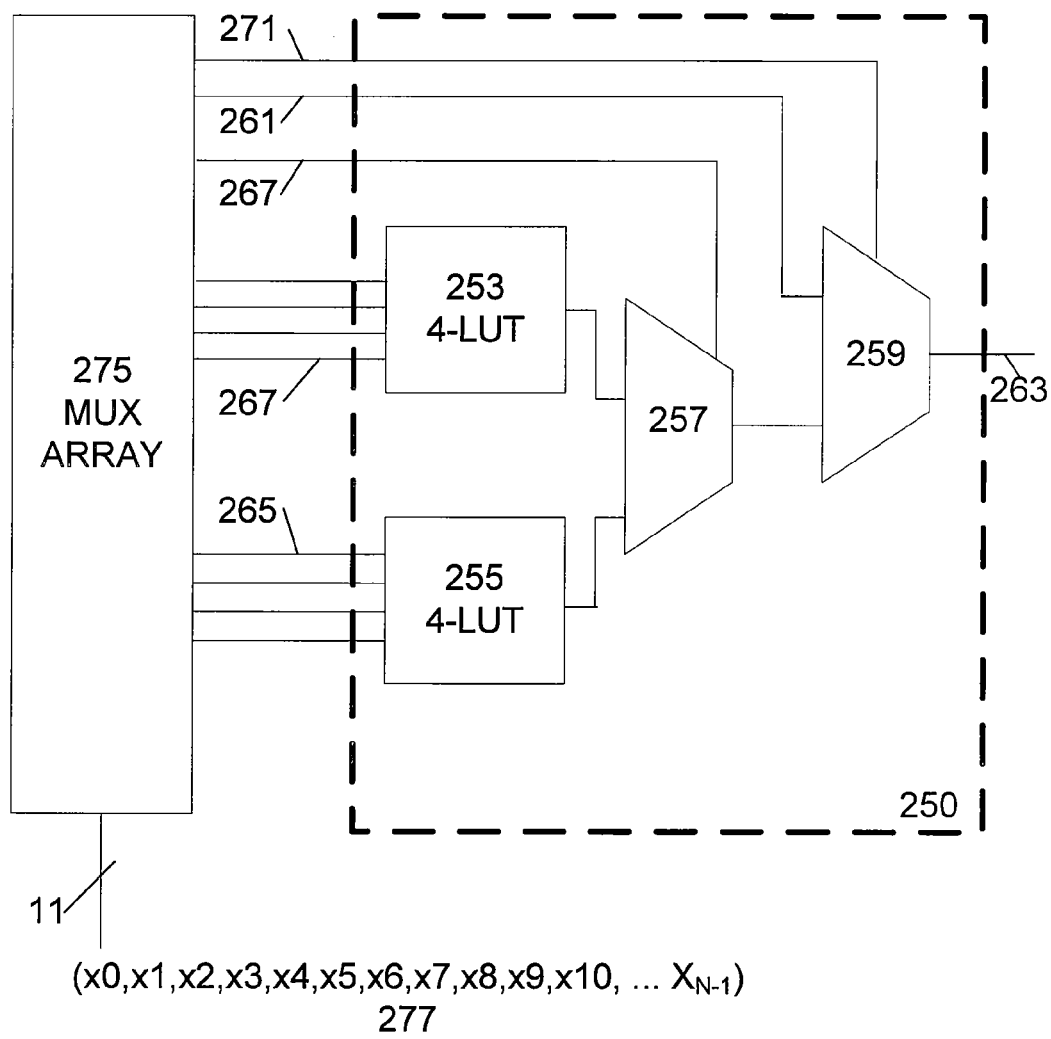
Figure 3A:
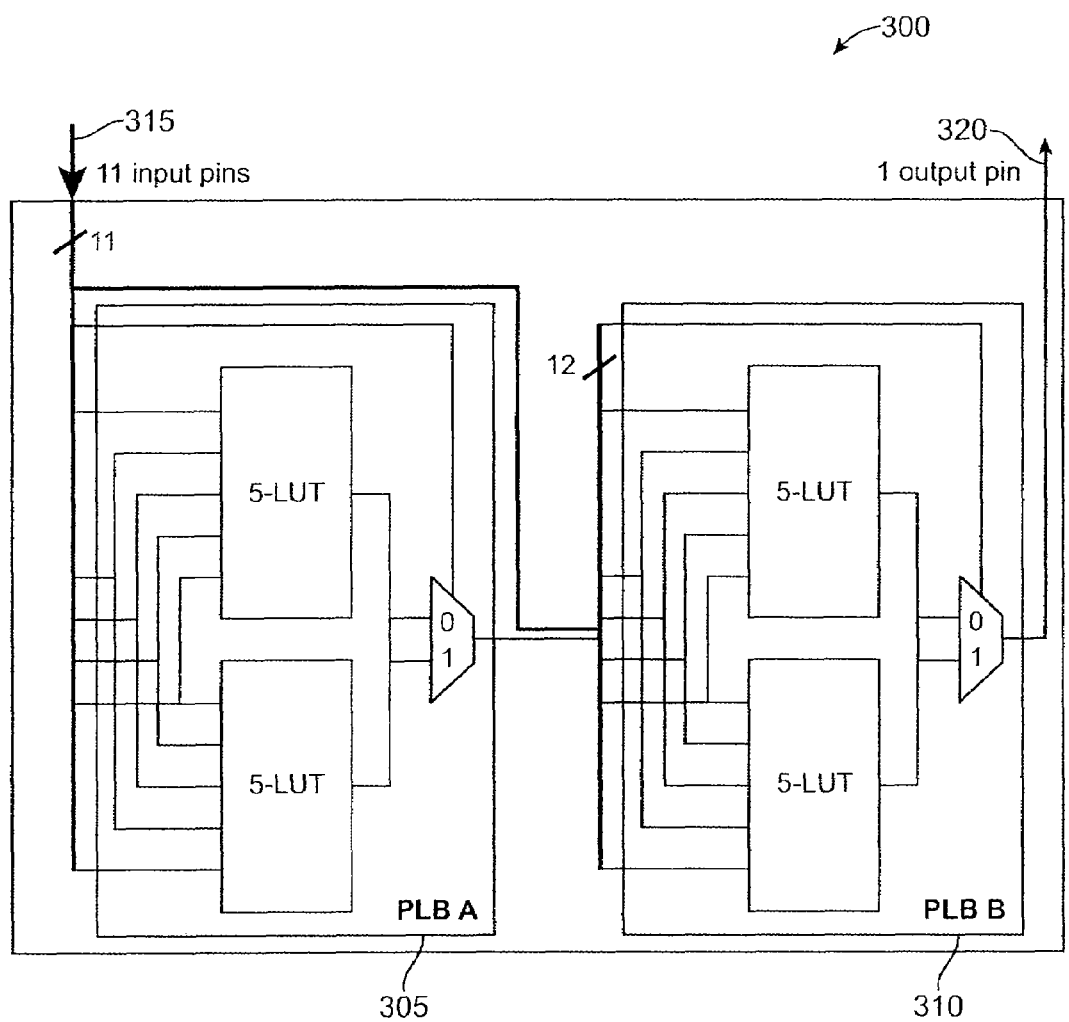
FIGS. 3A-3C illustrate example logic block configurations suitable for use with embodiments of the invention.
Figure 3B:
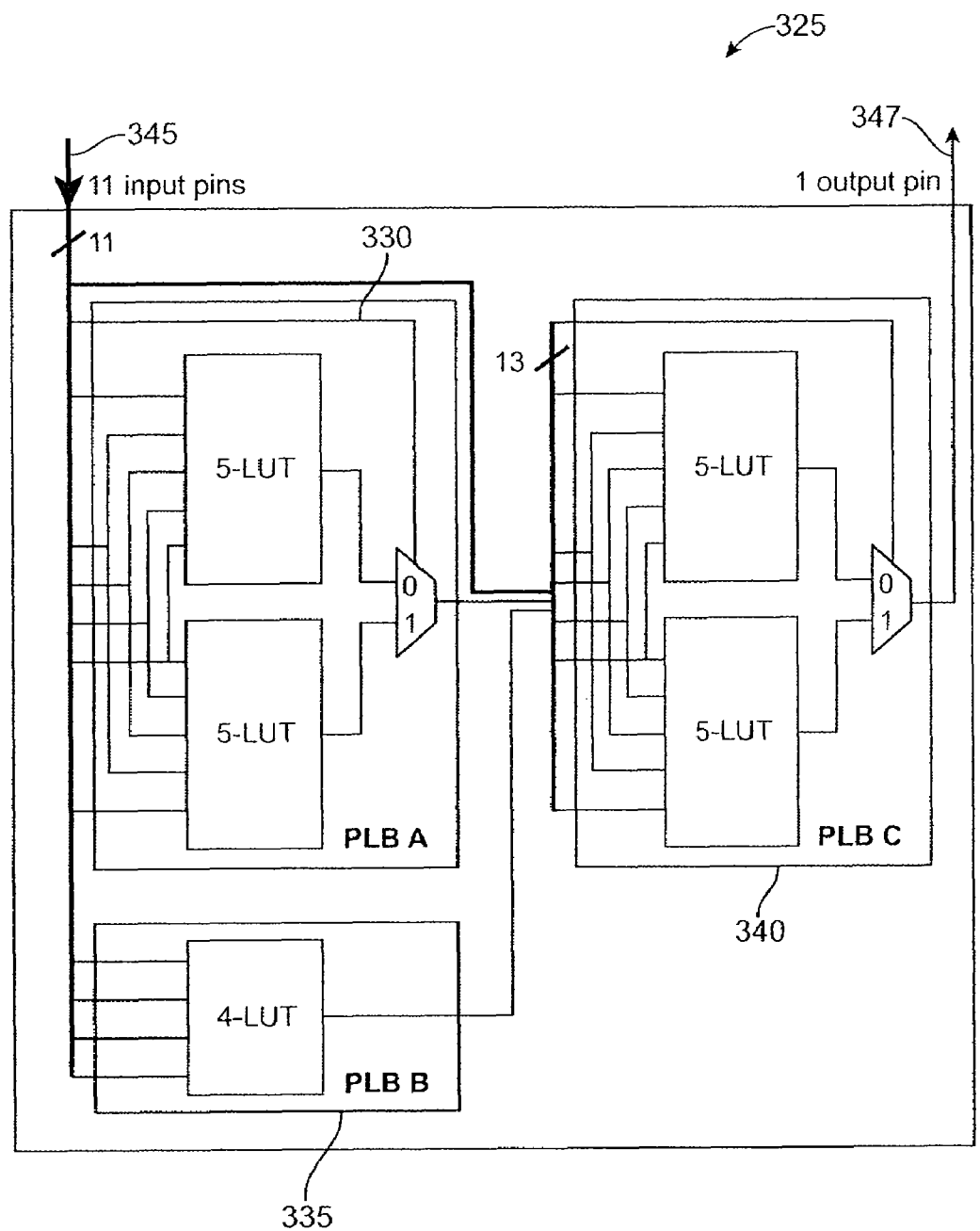
Figure 3C:
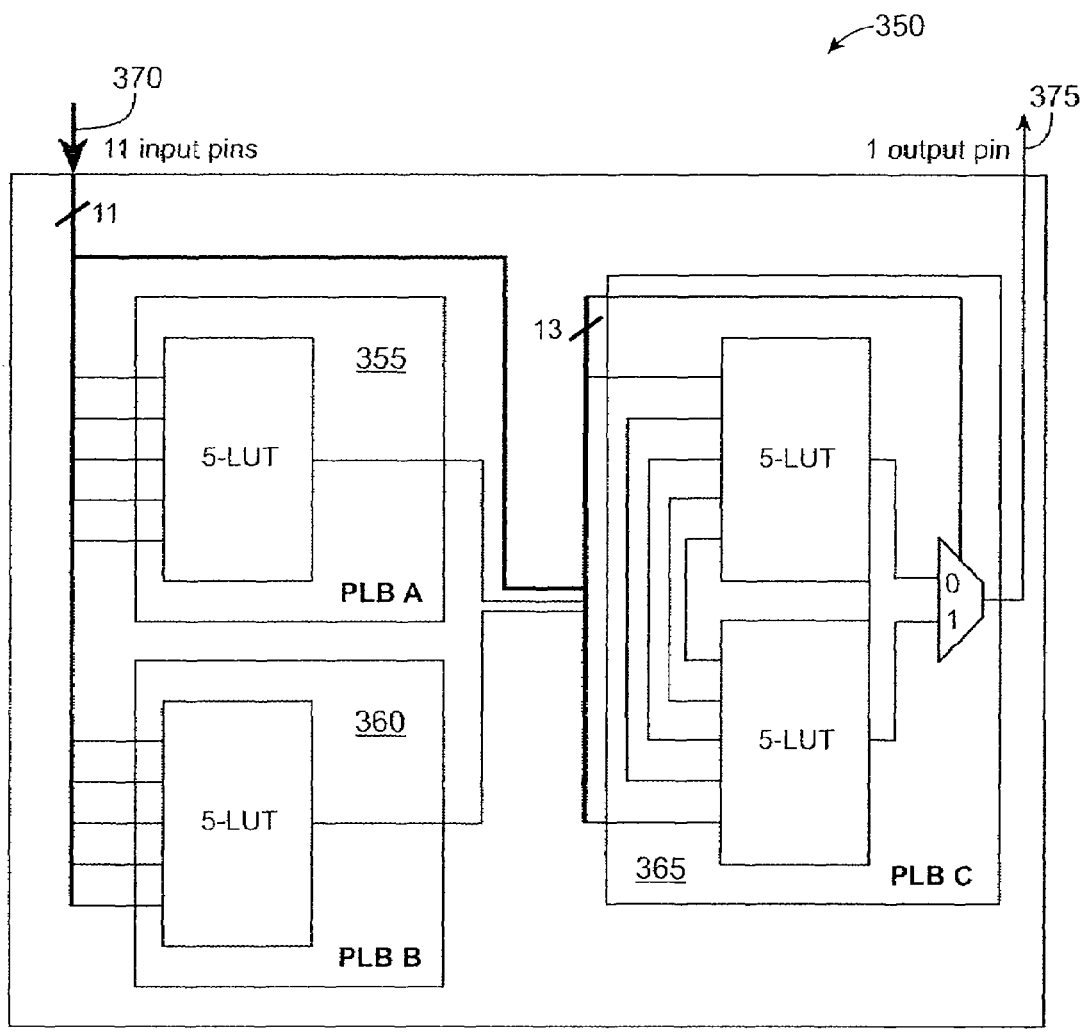

Step 105 also selects a hardware configuration of one or more logic blocks and/or programmable device resources to potentially implement the function. FIGS. 2A-2B illustrate an example logic blocks and FIGS. 3A-3C illustrate example logic block hardware configurations suitable for use with an embodiment of the invention. These examples are provided for the purpose of illustration and are not intended to limit the application of embodiments of the invention to specific types of logic blocks, specific hardware configurations of one or more logic blocks, or functions having a specific number of inputs.

FIG. 2A illustrates an logic block 205 and associated hardware suitable for use with an embodiment of the invention. Logic block 205 includes five input look-up tables (LUTs) 207 and 209. The output of LUTs 207 and 209 are connected with multiplexer 213, which in turn is connected with logic block output 213.

Each of LUTs 207 and 209 share a set of four function input variables 215. Additionally, a fifth function input variable 217 is provided only to LUT 207. Similarly, a fifth function input variable 219 is provided only to LUT 209. An additional function input variable 221 controls multiplexer 211 to determine whether the output of LUT 207 or LUT 209 is connected with the logic block output 213.

For mathematical convenience in searching for an implementation of a function with N inputs using logic block 205 alone or in combination with other logic blocks, a virtual multiplexer array 223 is used to map all or a portion of the set of N function input variables 225 to specific inputs 215, 217, 219, and 221 of the logic block 205. Virtual multiplexer array 223 may be a mathematical construct used to determine valid function implementations only, and thus may be omitted from the actual hardware used to implement the function on a programmable device.

FIG. 2B illustrates an logic block 250 and associated hardware suitable for use with an embodiment of the invention. Logic block 250 includes four input look-up tables (LUTs) 253 and 255. The output of LUTs 253 and 255 are connected with multiplexer 257, which in turn is connected with multiplexer 259, which in turn is connected with logic block output 263.

LUT 253 is provided with four function input variables 267. Similarly, LUT 255 is provided with another four function input variables 265. An additional function input variable 269 controls multiplexer 257 to determine whether the output of LUT 253 or LUT 255 is connected with multiplexer 259. Function input variable 261 is also connected with multiplexer 259. Another function input variable 271 controls multiplexer 259 to determine whether the output of multiplexer 257 or the function input variable 261 is provided to the logic block output 263.

Similar to logic block 205, a virtual multiplexer array 275 is used to map all or a portion of the set of N function input variables 277 to specific inputs 261, 265, 267, 269, and 271 of the logic block 250. Virtual multiplexer array 275 may be a mathematical construct used to determine valid function implementations only, and thus may be omitted from the actual hardware used to implement the function on a programmable device.

These example logic blocks are provided for the purposes of illustration and embodiments of the invention can be used for any type of logic block.

FIGS. 3A-3C illustrate example logic block configurations suitable for use with embodiments of the invention. FIG. 3A illustrates a logic block configuration 300 including a pair of logic blocks, 305 and 310. The output of logic block 305 is provided as one of the inputs to logic block 310. A set of eleven function input variables 315 is partitioned so that a subset of seven function input variables is provided to logic block 305. Similarly, the set of eleven function input variables 315 is partitioned so that a subset of six function input variables and the output of logic block 305 are provided to logic block 310. The output 320 of logic block 310 is the output of the function.

FIG. 3B illustrates a logic block configuration 325 including three logic blocks, 330, 335 and 340. The outputs of logic block 330 and 335 are provided as inputs to logic block 340. A set of eleven function input variables 345 is partitioned so that a subset of seven function input variables is provided to logic block 330 and a subset of four function input variables is provided to logic block 335. Similarly, the set of eleven function input variables 345 is partitioned so that a subset of five function input variables and the outputs of logic block 330 and 335 are provided to logic block 340. The output 347 of logic block 340 is the output of the function.

FIG. 3C illustrates a logic block configuration 350 including three logic blocks, 355, 360 and 365. The outputs of logic block 355 and 360 are provided as inputs to logic block 365. A set of eleven function input variables 370 is partitioned so that a subset of five function input variables is provided to logic block 355 and a subset of five function input variables is provided to logic block 360. Similarly, the set of eleven function input variables 370 is partitioned so that a subset of five function input variables and the outputs of logic block 355 and 360 are provided to logic block 365. The output 375 of logic block 365 is the output of the function.

The above example hardware configurations are provided for the purposes of illustration and embodiments of the invention can use hardware configurations with any number of function inputs and any number of logic blocks arranged in any manner.

Returning to method 100, step 110 partitions the set of function input variables into subsets for the logic blocks of the selected hardware configuration. Each subset of function input variables is assigned to one of the logic blocks of the selected hardware configuration. In an embodiment, step 110 can partition the set of function input variables into subsets in any arbitrary manner. The number of function input variables in each subset is less than or equal to the number of inputs of its associated logic block. The subsets of function input variables may be exclusive or may partially or wholly intersect.

Step 115 determines a mathematical approximation of a potential implementation of the function with the selected hardware configuration using the function input variable partitioning from step 110. In an embodiment, step 115 mathematically approximates a function implementation by assuming that each logic block is a simple look-up table. For example, the seven input logic block 205 discussed above would be approximated as a seven input look-up table (LUT) having $2^7$, or 128 bits, of storage. In contrast, logic block 205 actually has only $2^6$, or 64 bits, of storage. Similarly, the eleven input logic block 250 discussed above would be approximated by step 115 as an eleven input LUT having $2^{11}$, or 2048 bits, of storage.

In an embodiment, step 115 creates a Boolean satisfiability equation. Typically, the Boolean satisfiability equation expresses the mathematical relationship between the partitioning of input variables to logic blocks, the assignment of input variables within each subset to specific logic block inputs, the internal functions of each logic block, the connections between logic blocks in the selected hardware implementation, and the desired output values of the function for any given input values. If the Boolean satisfiability equation evaluates as true, then the partitioning of input variables to logic blocks, the assignment of input variables within each subset to specific logic block inputs, and the selected hardware configuration represent a valid implementation of the function. Conversely, if the Boolean satisfiability equation evaluates as false, then the partitioning of input variables to logic blocks, the assignment of input variables within each subset to specific logic block inputs, and the selected hardware configuration do not represent a valid implementation of the function.

Using the approximation of representing logic blocks as simple look-up tables, step 115 can simplify the Boolean satisfiability equation. Because each logic block is represented as a LUT, rather than multiple LUTs in combination with multiplexers and/or other logic gates, an exact assignment of function input variables to logic block inputs is not necessary, as valid look-up table values can be found for any permutation of function input variable assignments to the inputs of a LUT. Thus, the assignment of input variables to specific logic block inputs can be removed from the Boolean satisfiability equation.

Figure 4A:
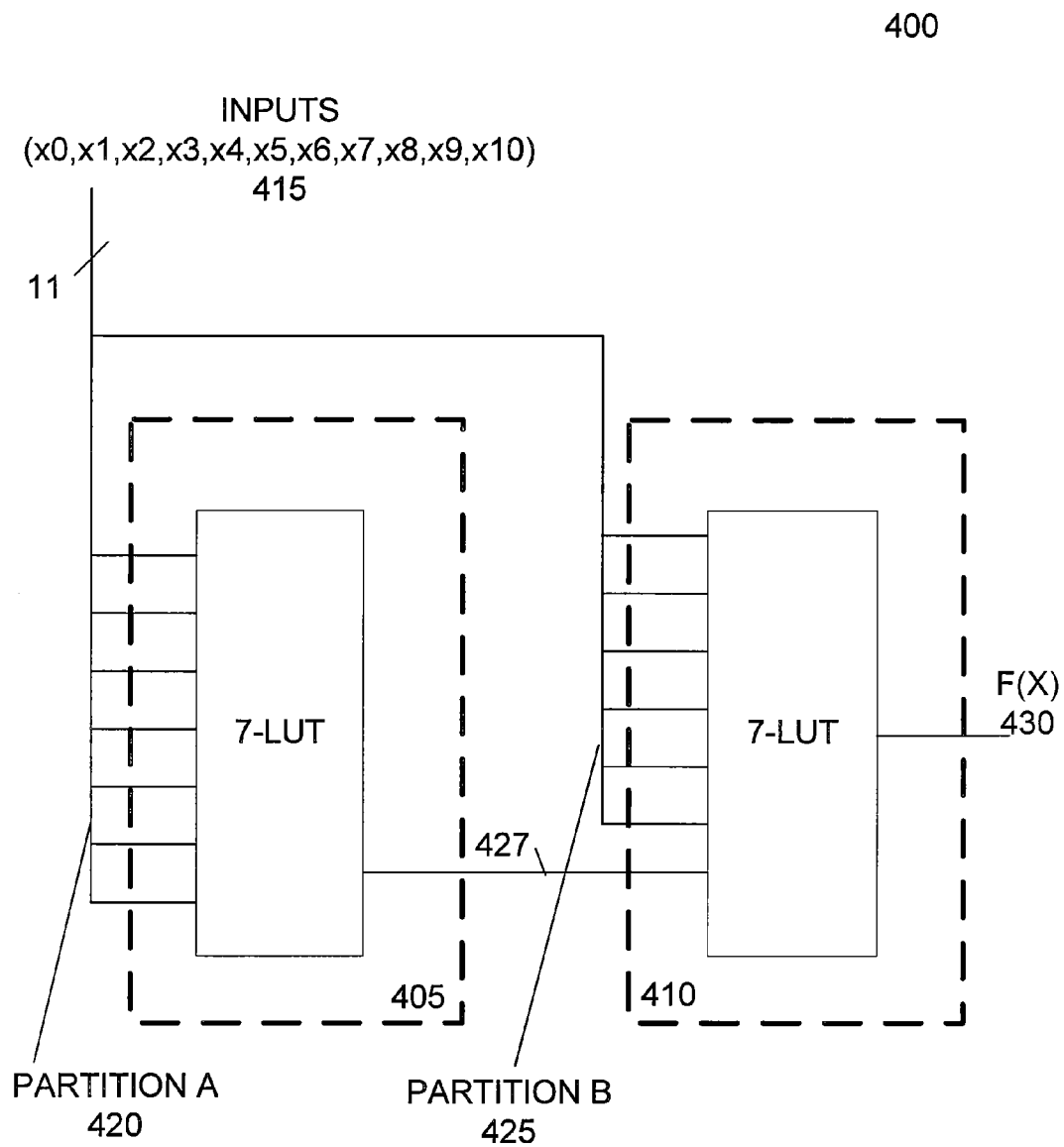
FIGS. 4A-4B illustrate an example application of a method of efficiently searching for valid function implementations according to an embodiment of the invention.

FIG. 4A illustrates an example hardware configuration 400 corresponding with the approximation of a function implementation created by step 115. Example hardware configuration 400 is an approximation of the hardware configuration 300 in FIG. 3A, discussed above. Example hardware configuration 400 includes logic blocks 405 and 410, similar to logic blocks 305 and 310. However, hardware configuration 400 represents each logic block as a seven input LUT, having $2^7$ or 128 bits of storage, rather than the combination of smaller LUTs and multiplexers as in hardware configuration 300.

Additionally, the example hardware configuration 400 includes a set of eleven function input variables 415. Partition A 420 is a subset of set 415, including seven of these function input variables. Partition A 420 is provided as input to logic block 405. Partition B 425 is a subset of set 415, including six of these function input variables and the output 427 of logic block 405. Partition B 425 is provided as input to logic block 410. If example hardware configuration 400 is a valid implementation of the function, then the output 430 of logic block 410 should be equal to the function for all input values. In this example hardware configuration 400, function input variables can be assigned to any arbitrary input of their respective logic blocks without affecting the potential validity of the implementation of the function.

Returning to method 100, an embodiment of step 115 expresses the Boolean satisfiability equation in a conjunctive normal form (CNF). A CNF expression includes a set of clauses AND'ed, or conjoined together. Each clause includes variables or their negations that are OR'ed together. A CNF expression of the Boolean satisfiability equation can include function input variables, function outputs, and intermediate variables associated with the hardware implementation. A CNF expression of the Boolean satisfiability equation will only evaluate as true if each clause also evaluates as true.

Boolean satisfiability equation in CNF are well known in the art for standard types of logic gates. Additionally, the Boolean satisfiability equation for more complicated combinatorial logic circuits can be obtained through the logical AND of the Boolean satisfiability equations of its constituent logic gates.

For example, an AND gate can be represented as the Boolean function X=AB. This function indicates that the value X is the logical AND of inputs A and B. An equivalent Boolean satisfiability equation in CNF, abbreviated as $\Phi$, is: $\Phi$=($\bar{X}$+A)($\bar{X}$++B)($\bar{A}$+$\bar{B}$+X).

In this example, the Boolean satisfiability equation $\Phi$ will evaluate to "true" or "1" only when the values of A, B and X are consistent with the function X=AB. For example, if (A,B,X)=(1,1,1), $\Phi$=1 as well, because each of the clauses of $\Phi$ evaluates to "1". Similarly, if (A,B,X)=(1,0,0), then $\Phi$=1 as well. Both of these sets of values are consistent with the function X=AB. However, if (A,B,X)=(1,0,1), which is inconsistent with X=AB, then clause ($\bar{X}$+B) will be "0." As a result, $\Phi$: 0, indicating that this set of values of A, B, and X is inconsistent with the function X=AB.

Returning to method 100, step 120 evaluates the Boolean satisfiability equation determined in step 115 for consistency with the function input variables and output values. As discussed above, the Boolean satisfiability equation determined in step 115 represents an approximation of the hardware configuration selected for implementing the function, along with the partitioning of function input variables to logic blocks determined in step 110.

In an embodiment, step 120 can use any type of Boolean satisfiability (SAT) solver or algorithm known in the art. This can include algorithms as described in "FPGA technology mapping: a study of optimality," A. Ling, D. Singh, and S. Brown, DAC, 2005, pp. 427-432, as discussed above. Typical SAT algorithms can employ optimized branch-and-bound procedures such as "smart" decision making, conflict based learning, and chronological backtracking to solve large SAT problems with millions of clauses and thousands of variables. Other embodiments can utilize other types of algorithms for determining whether the approximation of the hardware configuration selected for implementing the function and the selected partitioning of function input variables to logic blocks is consistent with the function input variable and output values.

If step 120 determines that the approximation of the selected hardware configuration and the partitioning of function input variables to logic blocks is not consistent with the function input variable and output values, method 100 returns to step 110. Step 110 may then select a different partitioning of the function input variables. Steps 110, 115, and 120 may be repeated numerous times to evaluate different partitionings of the input variables. If all of the possible partitionings of function input variables have been evaluated and deemed inconsistent with the function in step 120, then an embodiment of method 100 halts and a message is returned to indicate that the implementation of the function with the selected hardware configuration was unsuccessful. In a further embodiment, method 100 may be repeated with alternate hardware configurations to attempt to implement the function.

If step 120 determines that the approximation of the selected hardware configuration and the partitioning of function input variables to logic blocks is consistent with the function input variable and output values, method 100 proceeds to step 125. Step 125 creates a refined representation of the selected hardware configuration and partitioning of the function input variables. In an embodiment, step 125 represents each logic block in its actual form, such as the examples shown in FIGS. 2A-2C, rather than as a simple look-up table, such as the example shown in FIG. 4A.

However, an embodiment of step 125 maintains the partitioning of function input variables to logic blocks that was previously determined. In this embodiment, the partitioning of function input variables only allows the function input variables of a partition to be assigned to the inputs of its associated logic block. For example, if partition A is assigned to logic block A and includes function input variables X0 and X1, and partition B is assigned to logic block B and includes function input variables X1 and X2, then function input variable X1 may only be assigned to an input of logic block A, function input variable X2 may only be assigned to an input of logic block B, and function input variable X1, which is in both partitions, may be assigned to inputs of both logic blocks A and B.

The use of the partitioning of function input variables in step 125 greatly reduces the number of potential function input variable assignments that may be considered in searching for valid implementations of the function. For example, implementing an eleven input function using the hardware configuration of 300 of FIG. 3A without any input partitioning restrictions may require the consideration of 11! or over 39,000,000 different permutations of potential input assignments to logic block inputs. In contrast, partitioning the set of eleven function input variables into two equal subsets of function input variables reduces the number of permutations of potential input assignments to logic block inputs to only 720.

In an embodiment, step 125 creates a Boolean satisfiability equation. The Boolean satisfiability equation expresses the mathematical relationship between the partitioning of input variables to logic blocks, the assignment of input variables within each subset to specific logic block inputs, the internal functions of each logic block, the connections between logic blocks in the selected hardware implementation, and the desired output values of the function for any given input values. In an embodiment, step 125 expresses the Boolean satisfiability equation in a conjunctive normal form (CNF), as described above.

Figure 4B:
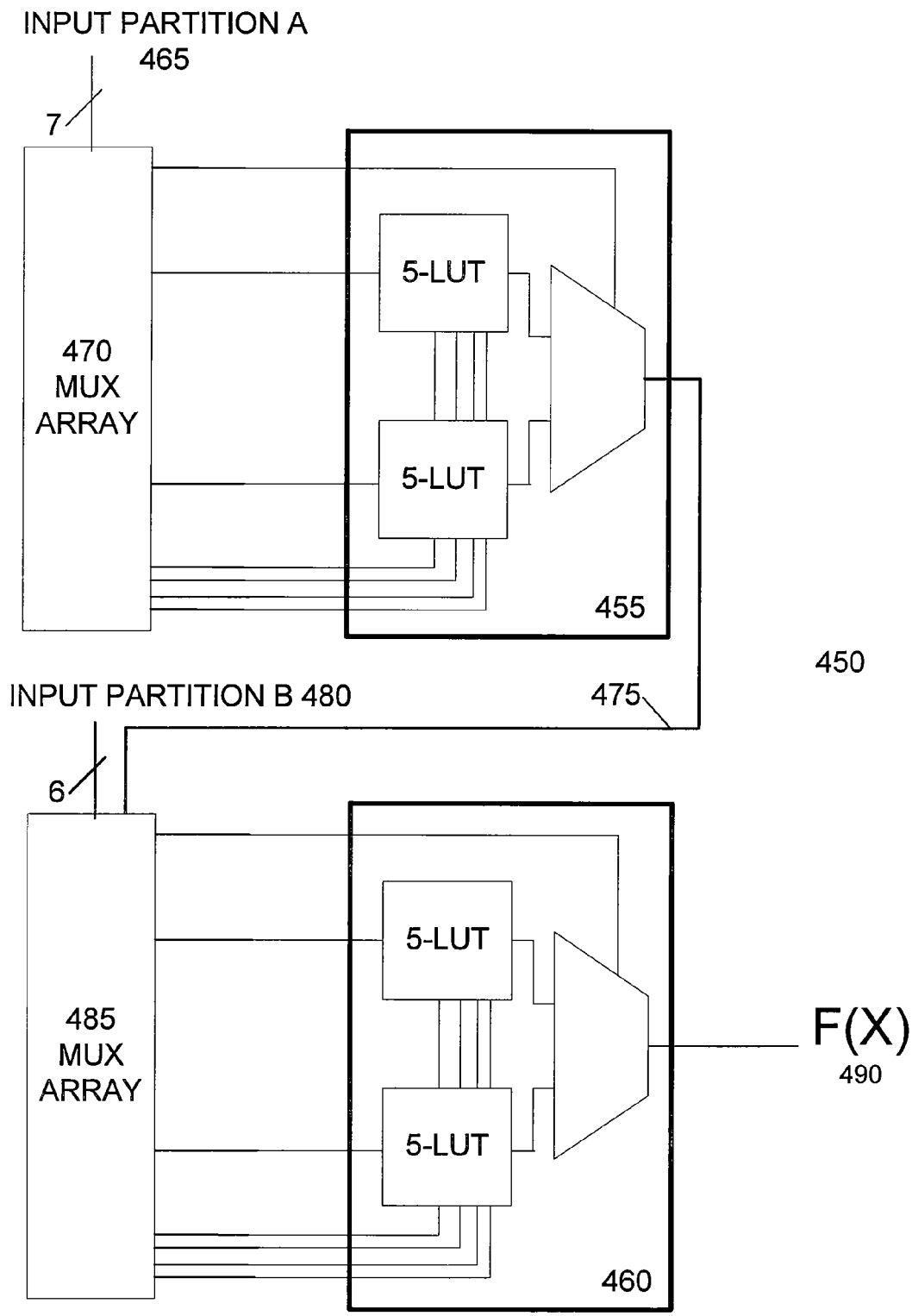

FIG. 4B illustrates an example hardware configuration 450 corresponding with the refined representation of a function implementation created by step 125. Example hardware configuration 450 is similar to the hardware configuration 300 in FIG. 3A, with the addition of the partitioning of function input variables discussed above. Example hardware configuration 450 includes logic blocks 455 and 460, similar to logic blocks 305 and 310.

Additionally, the example hardware configuration 450 includes a set of eleven function input variables partitioned into two subsets, one for each logic block. Partition A 465 includes seven of these function input variables. Partition A 465 is provided as inputs to virtual multiplexer array 470. Virtual multiplexer array 470 can be used to assign each function input variable of partition A 465 to a specific input of logic block 455. As discussed above, virtual multiplexer array 470 is provided for mathematical convenience and does not have to be included in the actual hardware implementation of the function within the programmable device.

Similarly, the output 475 of logic block 455 and partition B 480, including six function input variables, is provided to virtual multiplexer array 485. Virtual multiplexer array 485 can be used to assign each function input variable of partition B 480 and the output 475 to specific inputs of logic block 460. Virtual multiplexer array 485 is provided for mathematical convenience and does not have to be included in the actual hardware implementation of the function within the programmable device. The output 490 of logic block 460 should be equal to the function for all input values if example hardware configuration 450, including the assignment of function input variables to specific logic block inputs, is a valid implementation of the function.

Returning to method 100, optional step 130 can add constraints to the representation of the hardware configuration determined in step 125 to reduce the size of the search space evaluated in finding valid function implementations. In an embodiment, constraints can be expressed as conflict clauses in CNF. For example, if it is known that an example assignment of input variables (a=0; b=1; z=1) is not part of a valid implementation of the function, then a conflict clause in the form $(a+\bar{b}+\bar{z})$ can be logically AND'ed with the CNF representation of the hardware configuration to direct the SAT solver or other Boolean satisfiability algorithm to ignore potential solutions that include this invalid assignment.

Embodiments of step 130 can add constraints or conflict clauses from many different types of observations about the selected hardware configurations and input partitioning. For example, a set of constraints can be added to ensure that function input variables cannot be assigned to logic block inputs outside of their respective partitions.

In a further embodiment, additional constraints or conflict clauses can be added to the Boolean satisfiability equation of the function and its hardware configuration. For example, constraints or conflict clauses can be added to prevent the same function input variable from being assigned to multiple inputs of the same look-up table within a logic block. In another example, constraints or conflict clauses can be added to ensure that each function input variable is used by at least one logic block. Boolean tautologies can be used to derive additional constraints of conflict clauses. For example, if all of a multiplexer's inputs are set to "0" or "1", then the multiplexer output will be "0" or "1," respectively, regardless of the values of the multiplexer's select lines. Conflict clauses representing this property or similar types of properties can be added to the Boolean satisfiability equation. In another example, step 130 can add conflict clauses to prevent alternative permutations of unsuccessful input variable partitionings or assignments from being considered in subsequent iterations of method 100.

In further embodiments, discussed in detail below, additional constraints and conflict clauses determined during the processing of other functions can be reused and added to the Boolean satisfiability equation for the current function. In still further embodiments, additional constraints and conflict clauses derived from other types of observations about logic blocks and hardware configurations.

Following optional step 130, step 135 evaluates the Boolean satisfiability equation determined in step 125 and possibly constrained in step 130 for consistency with the function input variables and output values. In an embodiment, step 135 may consider numerous permutations of assignments of function input variables to logic block inputs to determine one or more valid implementations of the function with the selected hardware configuration. As with step 120, step 135 can use any type of Boolean satisfiability (SAT) solver or algorithm known in the art. Other embodiments can utilize other types of algorithms for determining whether the hardware configuration selected for implementing the function and the assignment of function input variables to logic block inputs is consistent with the function input variables and output values.

If step 135 cannot find any valid assignments of function input variables to logic block inputs, an embodiment of method 100 returns to step 110 to select an alternate partitioning of function inputs between the logic cells. Steps 110, 115, and 120 may be repeated numerous times to evaluate different partitionings of the input variables. Steps 125, 130, and 135 may be repeated numerous times to evaluate the assignments of function input variables to logic block inputs for different input partitionings. If all of the possible partitionings of function input variables have been evaluated without finding a valid implementation of the function for the selected hardware configuration, an embodiment of method 100 halts and a message is returned to indicate that the implementation of the function with the selected hardware configuration was unsuccessful. In a further embodiment, method 100 may be repeated with alternate hardware configurations to further attempt to implement the function.

If step 135 determines one or more valid assignments of function input variables to logic block inputs, an embodiment of method 100 halts and outputs the selected hardware configuration, one or more valid function input variable assignments, and the data values for one or more look-up tables of one or more logic blocks. This information can be used by a compilation process to convert user designs including the function into programmable device configurations.

While searching for valid function implementations, SAT solvers often encounter conflicts due to two or more function input variable assignments being inconsistent with the Boolean satisfiability equation for the function and its selected hardware configuration. In response, many typical SAT solvers will generate additional constraints or conflict clauses to be included in the Boolean satisfiability equation. The presence of these additional conflict clauses prevents the SAT solver from considering other potential solutions that include previously considered invalid assignments. Previously, these additional constraints or conflict clauses are specific to a function and the selected hardware configuration and cannot be reused for different functions. Thus, the SAT solver must "discover" additional conflict clauses for each function.

In an embodiment, step 130 can reuse constraints, such as conflict clauses, previously determined during the processing of other functions. This decreases the time required for the execution of step 135, as the SAT solver searches a much smaller set of potential solutions from the beginning, rather than relying solely on conflict clauses discovered during the evaluation of a specific function.

In an embodiment, the Boolean satisfiability equation for the implementation of a function F using a hardware configuration H can be expressed as:

$$\Phi = \prod_{d=0}^{2^{|X|}-1} CNF(H_d) \cdot CNF(MUX(X)_d) \cdot BIN(d) \cdot F(d)$$

In this expression, d represents one set of values of the function input variables. F(d) represents the output value of the function F for a set of values of the function input variables. $CNF(H_d)$ represents the hardware configuration of logic blocks as a CNF expression. Similarly, $CNF(MUX(X)_d)$ BIN (d) represents the assignment of function input variables to logic block inputs using the virtual multiplexer array as a CNF expression.

It can be proven that conflict clauses not associated with the function output F(d) can be safely reused to help determine implementations of other functions having the same number of input variables using the same hardware configuration. For example, the conflict clauses arising from the evaluation of $CNF(H_d)$ and $CNF(MUX(X)_d)$ BIN(d) may specify relationships between input variables and specific bit locations in one or more look-up tables within logic blocks; however, these conflict clauses do not specify values of these bits of the look-up tables. Thus, when a different function is evaluated, these conflict clauses can be reused.

Figure 5A:
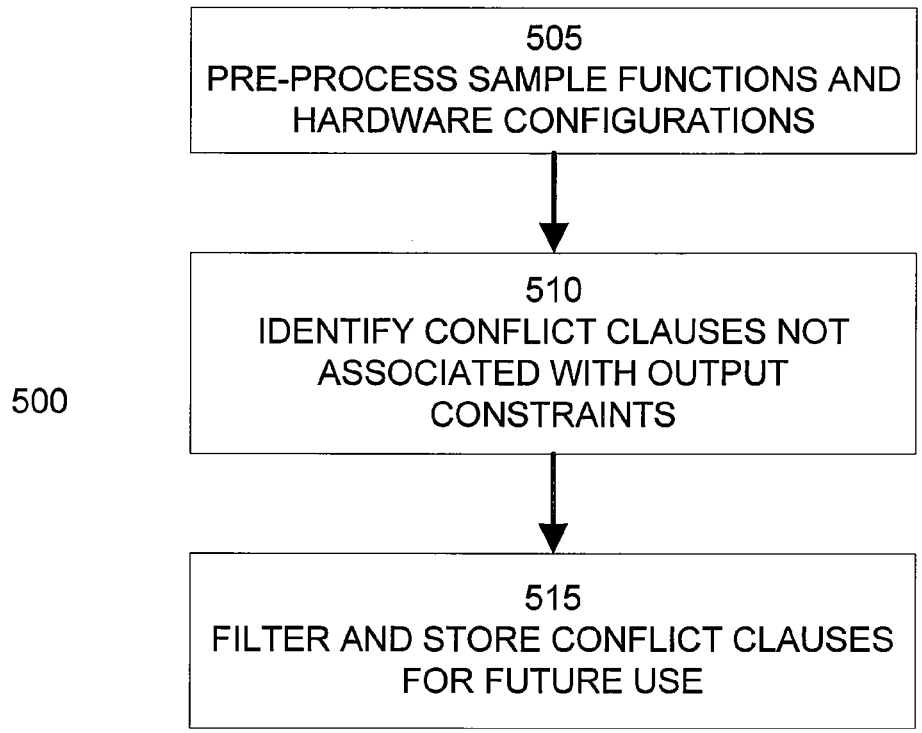
FIGS. 5A-5B illustrates a method of identifying additional constraints for further improving the efficiency of embodiments of the invention.

In an embodiment, a set of sample functions is preprocessed to create a database of conflict clauses to be used during subsequent evaluations of functions provided by user designs. FIG. 5A illustrates a method 500 of identifying additional constraints for further improving the efficiency of embodiments of the invention. Step 505 preprocesses one or more sample functions and one or more hardware configurations. Sample functions can be selected based on common elements of user designs. In further embodiments, representative user designs can be provided to a compilation process to extract one or more sample functions suitable for evaluation.

In an embodiment, step 505 attempts to determine one or more valid implementations of each sample function using one or more logic block hardware configurations, such as the example hardware configurations shown in FIGS. 3A-3C. Valid implementations of sample functions can be determined using any type of Boolean satisfiability or SAT solver. In a further embodiment, step 505 can use method 100 or similar techniques to determine valid implementations of the sample functions for one or more hardware configurations.

While processing Boolean satisfiability equations representing sample functions and hardware configurations, an embodiment of step 505 maintains information about conflict clauses added to each equation. This information can include the conflict clauses added to each equation; the portion of the Boolean satisfiability equation, such as portions representing the hardware configuration or function input variable assignments, from which each conflict clause is derived; characteristics of the function itself, such as the number of input variables; and characteristics of the hardware configuration.

Step 510 identifies conflict clauses arising from the processing of each combination of a sample function and associated hardware configuration that can be potentially reused to evaluate other functions. In an embodiment, step 510 uses the information associated with conflict clauses to identify conflict clauses derived from the $CNF(H_d)$ and $CNF(MUX(X)_d)$ BIN(d) expressions in Boolean satisfiability equations associated with each combination of a sample function and an associated hardware configuration. In another embodiment, step 510 identifies any conflict clause not associated with the output constraint expression F(d) in a Boolean satisfiability equation as potentially reusable.

Step 515 filters and stores conflict clauses identified in step 510 for future reuse. In an embodiment, step 515 discards conflict clauses deemed too large, and thus, too specific to be useful. For example, a conflict clause that includes more function input variables than a threshold value can be discarded. Step 515 stores the remaining conflict clauses in a database, one or more data files, or other data structures for future retrieval and reuse. In an embodiment, step 515 organizes the storage of conflict clauses so that one or more conflict clauses associated with a given number of function inputs and a hardware configuration can be easily retrieved.

Method 500 can be performed prior to the evaluation of functions provided by user designs, so that the storage of conflict clauses is available during processing of user designs. In a further embodiment, method 500 can be performed during the evaluation of functions derived from user designs as well, enabling the storage of conflict clauses to be updated or augmented with additional conflict clauses derived from user designs.

Figure 5B:
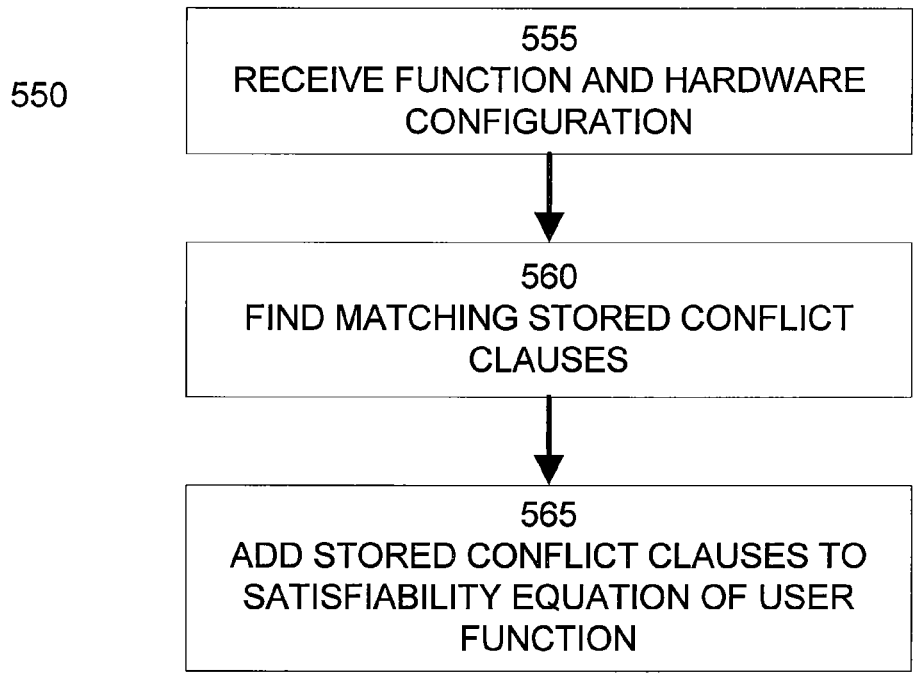

FIG. 5B illustrates a method 550 for applying previously stored conflict clauses to new functions. In an embodiment, method 550 is invoked by step 130 of method 100 discussed above. Step 555 receives a function and associated hardware configuration specified by a user design. In an embodiment, step 555 instead receives information describing pertinent aspects of the function and associated hardware configuration, such as the number of input variables of the function and the type of hardware configuration selected to attempt to implement the function.

Step 560 retrieves stored conflict clauses suitable for reuse with the function. In an embodiment conflict clauses suitable for reuse with a function include conflict clauses associated with sample functions having the same number of input variables as the function and associated with the same type of hardware configuration.

Step 565 adds the retrieved conflict clauses to the Boolean satisfiability equation associated with the function and its selected hardware configuration. In an embodiment, the Boolean satisfiability equation is expressed in CNF, to which the retrieved conflict clauses are logically AND'ed.

Following method 550, the modified Boolean satisfiability equation can be processed by a SAT solver to identify one or more valid implementations of the function using the selected hardware configuration. Because the additional conflict clauses often reduce the size of the search space analyzed by the SAT solver, the time required for this analysis is typically reduced substantially.

Figure 6:
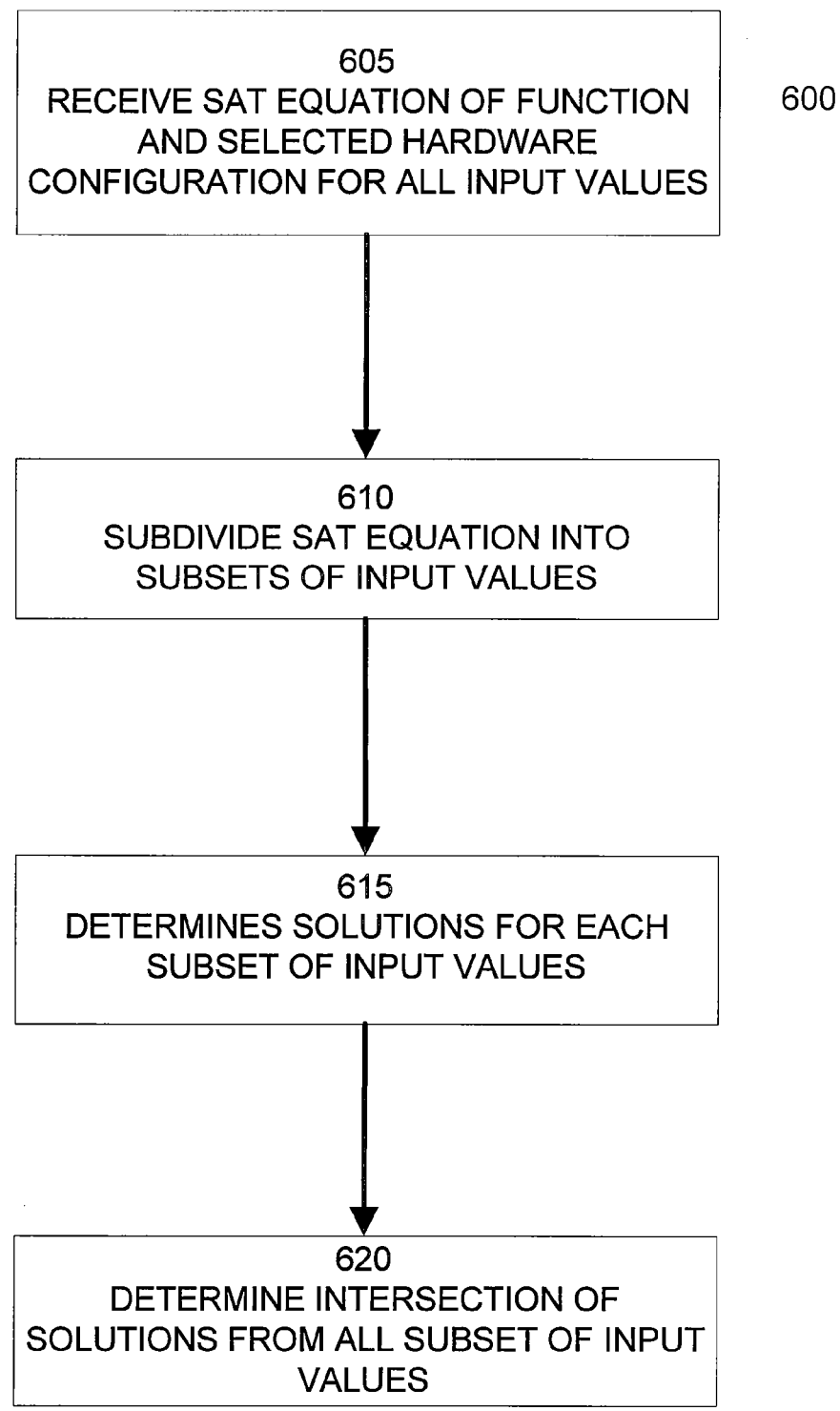
FIG. 6 illustrates a method of reducing the memory requirements for searching for valid function implementations according to an embodiment of the invention.

For functions with a large number of inputs and conflict clauses, the corresponding Boolean satisfiability equation, such as that shown above, may require large amounts of memory to evaluate. FIG. 6 illustrates a method 600 of reducing the memory and processing requirements for searching for valid function implementations according to an embodiment of the invention. In an embodiment, method 600 may be employed by steps 120 and 135 of method 100 and step 505 of method 500.

Step 605 receives a Boolean satisfiability equation representing a function and associated hardware configuration. In an embodiment, the Boolean satisfiability equation is expressed in CNF as described above. In this embodiment, the Boolean satisfiability equation can include clauses for all the permutations of function input and output values. A large function, such as a function with ten or more inputs, may include tens or hundreds of millions of clauses.

Step 610 subdivides the Boolean satisfiability equation into two or more subsets. In an embodiment, each subset is associated with a range of input variable values. For each subset, step 610 removes clauses of the Boolean satisfiability equation that pertain to input variable values outside of the range of the subset. Thus, the Boolean satisfiability equation of each subset has fewer clauses as a result of step 610.

Step 615 attempts to determine one or more solutions for each of the subsets. In an embodiment, step 615 uses the SAT solver techniques described above to attempt to find one or more sets of input variable assignments and LUT data that implement the function using the hardware configuration. Because the Boolean satisfiability equation of each subset has fewer clauses, the memory requirements for processing each subset are substantially reduced. If step 615 is successful in finding solutions for a subset, these solutions are stored. In a further embodiment, if the number of solutions found by step 615 exceed a threshold value, step 615 may stop searching for additional solutions before the search space is exhausted.

Step 620 evaluates the solutions found for all of the subsets of the Boolean satisfiability equation to find any solutions for the entire equation. In an embodiment, step 620 determines the intersection of solutions from all of the subsets to find any solutions to the entire Boolean satisfiability equation.

Figure 7:
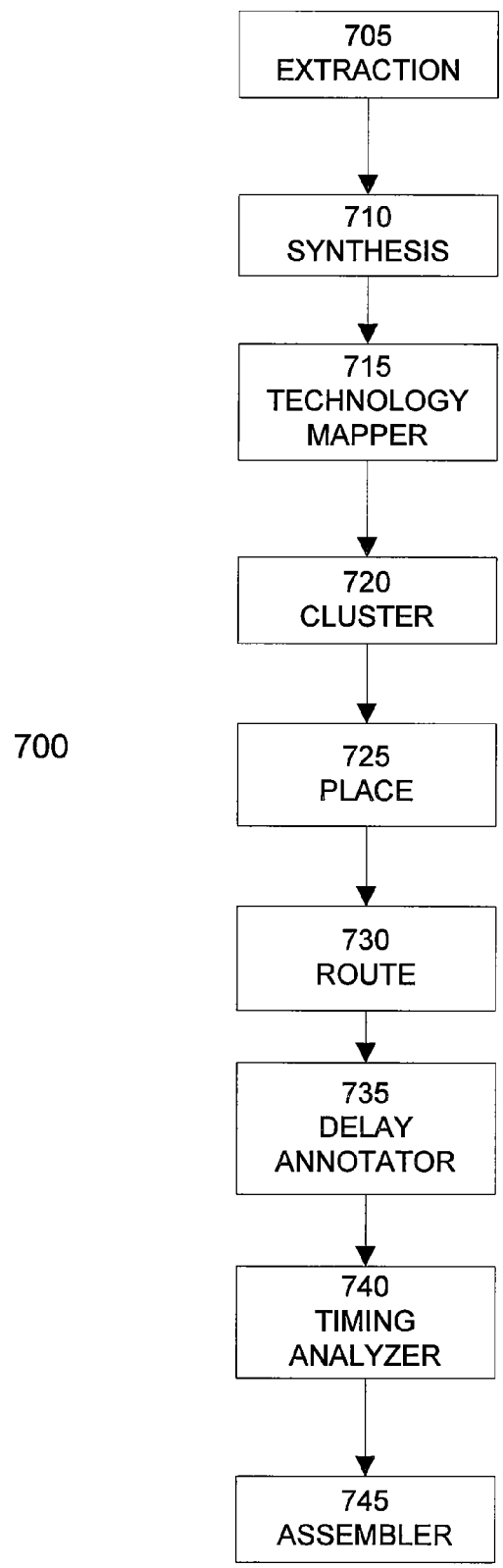
FIG. 7 illustrates a compilation process suitable for implementing an embodiment of the invention.

FIG. 7 illustrates a compilation process 700 suitable for implementing an embodiment of the invention. The compilation process 700 converts a user design into a programmable device configuration adapted to configure a programmable device to implement the user design. The extraction phase 705 converts a description of the user design, expressed for example in a hardware description language, into a register transfer layer description.

Synthesis phase 710 converts the register transfer layer description of the user design into a set of logic gates. Technology mapping phase 715 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design. Embodiments of the invention can be incorporated into or work in conjunction with the synthesis phase 710 and/or the technology mapping phase 715.

Following the technology mapping phase 715, the cluster phase 720 groups related atoms together into clusters. The place phase 725 assigns clusters of atoms to locations on the programmable device. The route phase 730 determines the configuration of the configurable switching circuit of the programmable device used to connect the atoms implementing the user design.

The delay annotator phase 735 determines the signal delays for the set of atoms and their associated connections in the configurable switching circuit using a timing model of the programmable device. The timing analysis phase 740 determines the maximum operating speed of the programmable device when implementing the user design, for example by determining the portions of the user design have the largest signal delay.

The assembler phase 745 generates a set of configuration information specifying the configuration of the programmable device implementing the user design, including the configuration of each of the logic cells used to implement the user design and the configuration of the configurable switching circuit used to connect the logic cells. The assembler phase 745 can write the configuration information to a configuration file, which can then be used to configure one or more programmable devices to implement instances of the user design.

Figure 8:
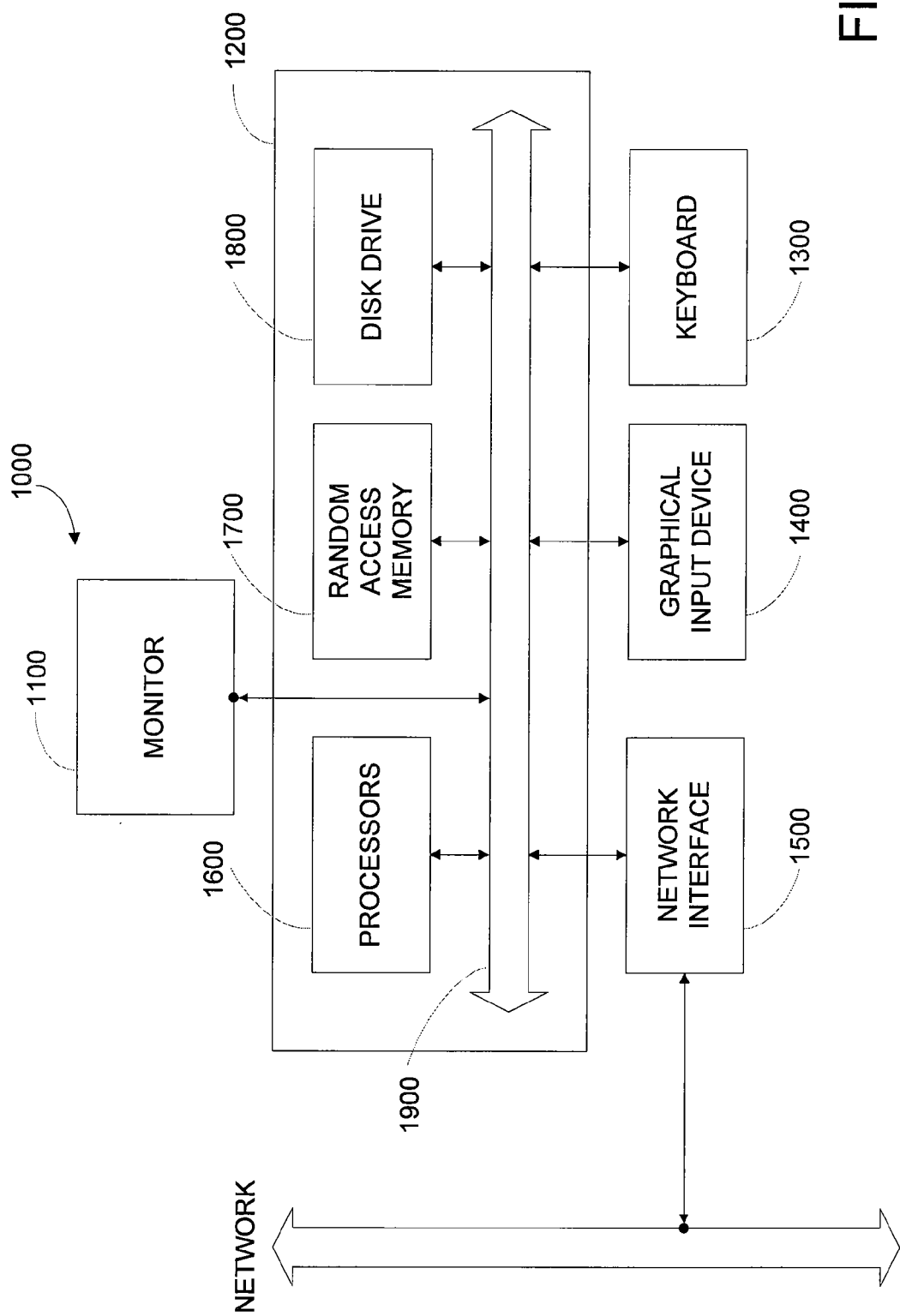
FIG. 8 illustrates a computer system 1000 suitable for implementing an embodiment of the invention.

FIG. 8 illustrates a computer system 1000 suitable for implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Figure 9:
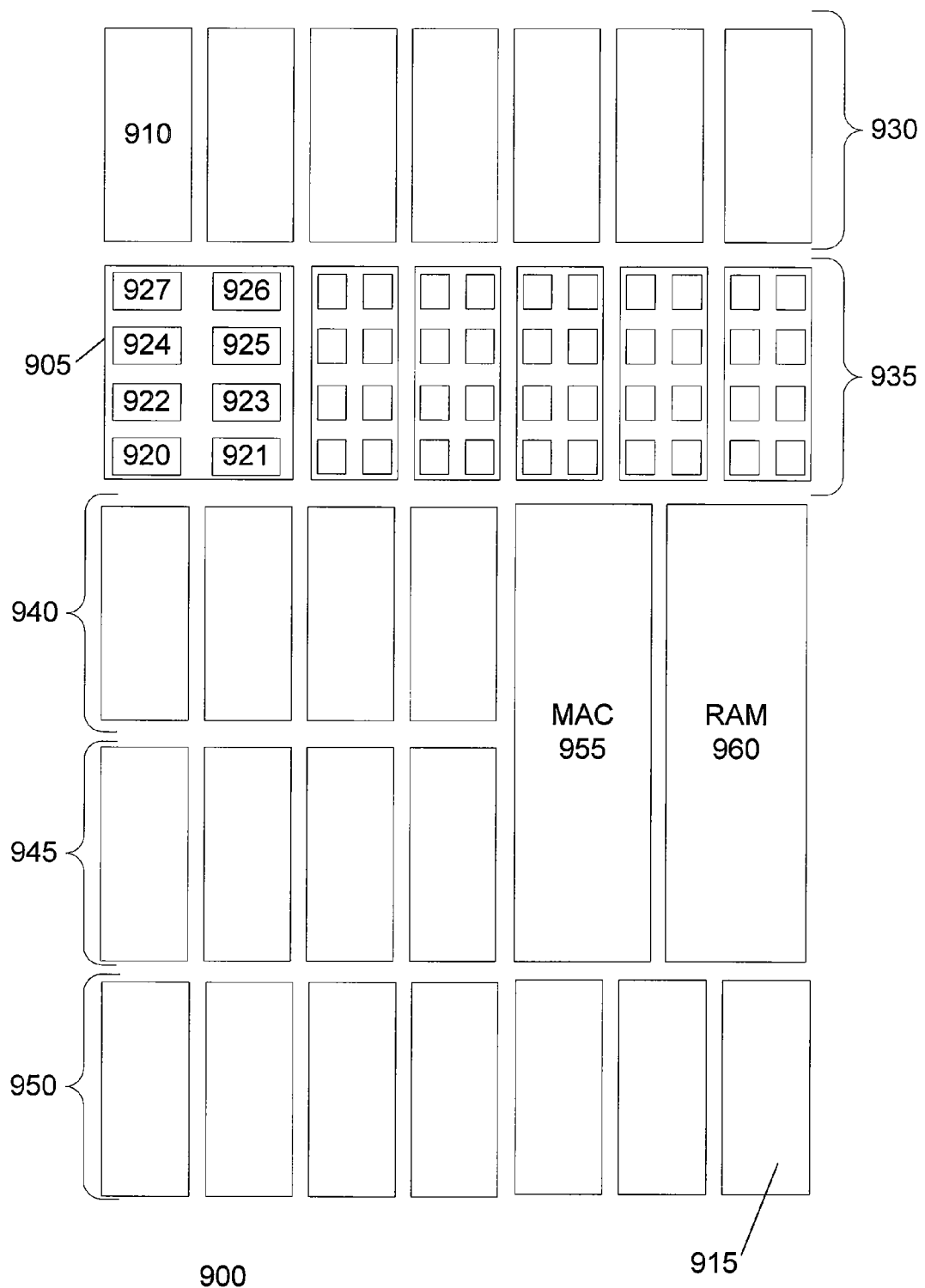
FIG. 9 illustrates a programmable device 900 suitable for implementing a user design processed with an embodiment of the invention.

FIG. 9 illustrates a programmable device 900 suitable for implementing a user design processed with an embodiment of the invention. Programmable device 900 includes a number of logic array blocks (LABs), such as LABs 905, 910, 915. Each LAB includes a number of programmable logic cells using logic gates and/or look-up tables to perform a logic operation. LAB 905 illustrates in detail logic cells 920, 921, 922, 923, 924, 925, 926, and 927. Logic cells are omitted from other LABs in FIG. 9 for clarity. The LABs of device 900 are arranged into rows 930, 935, 940, 945, and 950. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 900 also include specialized functional blocks, such as multiply and accumulate block (MAC) 955 and random access memory block (RAM) 960. For clarity, the portion of the programmable device 900 shown in FIG. 9 only includes a small number of logic cells, LABs, and functional blocks. Typical programmable devices will include thousands or tens of thousands of these elements.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of determining a configuration implementing a function using logic blocks of a programmable device, the method comprising:
   processing at least one sample function and at least one hardware configuration to determine at least one implementation of the at least one sample function with the at least one hardware configuration;
   analyzing a representation of each implementation of the at least one sample function with the at least one hardware configuration to identify a set of at least one relationship capable of reuse;
   storing the set of at least one relationship;
   receiving a user function to be potentially implemented with the at least one hardware configuration;
   creating a representation of at least one potential implementation of the user function with the at least one hardware configuration;
   retrieving at least a portion of the stored set of at least one relationship;
   augmenting the representation of at least one potential implementation of the user function with the retrieved portion of the stored set of at least one relationship; and
   analyzing the augmented representation of at least one potential implementation of the user function for consistency with the user function.

2. The method of claim 1, wherein the representations of implementations of the at least one sample function and the user function are Boolean satisfiability equations, and the at least one relationship capable of reuse is a conflict clause of a Boolean satisfiability equation.

3. The method of claim 2, wherein analyzing the augmented representation includes determining if the Boolean satisfiability equation corresponding with the representation of at least one potential implementation of the user function with the at least one hardware configuration is true for all values of the set of function input variables and all corresponding output values of the function.

4. The method of claim 1, wherein the at least one relationship capable of reuse is a portion of the representation of each implementation of the at least one sample function that is independent of output values of the at least one sample function.

5. The method of claim 1, wherein the at least one relationship capable of reuse is a portion of the representation of each implementation of the at least one sample function that is associated with the at least one hardware configuration.

6. The method of claim 1, wherein the at least one relationship capable of reuse is a portion of the representation of each implementation of the at least one sample function that is associated with an assignment of function input variables of the at least one sample function to inputs of the at least one hardware configuration.

7. The method of claim 1, wherein the representation of at least one potential implementation of the user function with the at least one hardware configuration includes a partitioning of user function input variables, wherein the partitioning includes an assignment of at least one subset of the user function input variables to at least one logic block of the at least one hardware configuration, such that the union of the assigned subsets is equal to the set of function input variables.

8. The method of claim 1, wherein the portion of the stored set of at least one relationship is derived from at least one sample function having a first number of function input variables and wherein the user function has the first number of function input variables.

9. The method of claim 1, wherein the portion of the stored set of at least one relationship is derived from an implementation of at least one sample function with a first hardware configuration and wherein the potential implementation of the user function includes the first hardware configuration.

* * * * *